(12) United States Patent
Sakamoto et al.

(10) Patent No.: US 7,659,209 B2
(45) Date of Patent: Feb. 9, 2010

(54) BARRIER METAL FILM PRODUCTION METHOD

(75) Inventors: Hitoshi Sakamoto, Yokohama (JP);
Naoki Yahata, Takasago (JP); Ryuichi Matsuda, Takasago (JP); Yoshiyuki Ooba, Yokohama (JP); Toshihiko Nishimori, Takasago (JP)

(73) Assignee: Canon Anelva Corporation, Kawasaki-Shi (JP)

( * ) Notice: Subject to any disclaimer, the term of this patent is extended or adjusted under 35 U.S.C. 154(b) by 392 days.

(21) Appl. No.: 11/798,883

(22) Filed: May 17, 2007

(65) Prior Publication Data

US 2007/0272655 A1 Nov. 29, 2007

Related U.S. Application Data

(60) Continuation-in-part of application No. 11/252,811, filed on Oct. 19, 2005, now abandoned, which is a division of application No. 10/277,733, filed on Oct. 23, 2002, now abandoned.

(30) Foreign Application Priority Data

| Nov. 14, 2001 | (JP) | ............................ 2001-348325 |
| Feb. 5, 2002 | (JP) | ............................ 2002-027738 |
| Feb. 21, 2002 | (JP) | ............................ 2002-044289 |
| Feb. 21, 2002 | (JP) | ............................ 2002-044296 |

(51) Int. Cl.
*H01L 21/00* (2006.01)

(52) U.S. Cl. ...................... 438/715; 438/710; 438/720; 438/759

(58) Field of Classification Search ................. 438/710, 438/715, 720, 759
See application file for complete search history.

(56) References Cited

U.S. PATENT DOCUMENTS 3,979,271 A 9/1976 Noreika et al. .............. 204/192

(Continued)

FOREIGN PATENT DOCUMENTS

EP 0477990 A2 4/1992

(Continued)

OTHER PUBLICATIONS

Kim et al.,"Mechanical Properties and Oxidation Behavior of Ti-Si-N Films Prepared by Plasma-Assisted CVD," Chemical Vapor Deposition, vol. 5, No. 6, pp. 275-279 (1999).

(Continued)

*Primary Examiner*—Fernando L Toledo
(74) *Attorney, Agent, or Firm*—Fitzpatrick, Cella, Harper & Scinto

(57) ABSTRACT

A $Cl_2$ gas plasma is generated at a site within a chamber between a substrate and a metal member. The metal member is etched with the $Cl_2$ gas plasma to form a precursor. A nitrogen gas is excited in a manner isolated from the chamber accommodating the substrate. A metal nitride is formed upon reaction between excited nitrogen and the precursor, and formed as a film on the substrate. After film formation of the metal nitride, a metal component of the precursor is formed as a film on the metal nitride on the substrate. In this manner, a barrier metal film with excellent burial properties and a very small thickness is produced at a high speed, with diffusion of metal being suppressed and adhesion to the metal being improved.

2 Claims, 11 Drawing Sheets

U.S. PATENT DOCUMENTS

| | | | |
|---|---|---|---|
| 5,228,052 A | 7/1993 | Kikuchi et al. | 373/18 |
| 5,522,343 A | 6/1996 | Kodama et al. | 118/723 |
| 5,614,070 A | 3/1997 | Moon | 204/298.07 |
| 5,685,942 A | 11/1997 | Ishii | 156/345 |
| 5,686,355 A | 11/1997 | Sumi et al. | 437/192 |
| 5,736,196 A | 4/1998 | Decker et al. | 427/341 |
| 5,753,320 A | 5/1998 | Mikoshiba et al. | 427/527 |
| 5,795,831 A | 8/1998 | Nakayama et al. | 438/714 |
| 5,855,745 A | 1/1999 | Manley | 204/192.12 |
| 5,972,179 A | 10/1999 | Chittipeddi et al. | 204/192.17 |
| 5,976,986 A * | 11/1999 | Naeem et al. | 438/714 |
| 6,008,136 A | 12/1999 | Wada | 438/723 |
| 6,040,012 A | 3/2000 | Anderbouhr et al. | 427/255.391 |
| 6,045,666 A | 4/2000 | Satitpunwaycha et al. | 204/192.17 |
| 6,071,572 A * | 6/2000 | Mosely et al. | 427/570 |
| 6,090,702 A | 7/2000 | Okamoto | 438/637 |
| 6,136,095 A | 10/2000 | Xu et al. | 118/719 |
| 6,153,519 A | 11/2000 | Jain et al. | 438/681 |
| 6,153,530 A * | 11/2000 | Ye et al. | 438/720 |
| 6,162,715 A | 12/2000 | Mak et al. | 438/592 |
| 6,171,661 B1 | 1/2001 | Zheng et al. | 427/535 |
| 6,238,739 B1 | 5/2001 | Madar et al. | 427/255.39 |
| 6,265,311 B1 | 7/2001 | Hautala et al. | 438/680 |
| 6,271,121 B1 | 8/2001 | Webb | 438/627 |
| 6,271,136 B1 | 8/2001 | Shue et al. | 438/687 |
| 6,294,469 B1 | 9/2001 | Kulkarni et al. | 438/689 |
| 6,352,049 B1 | 3/2002 | Yin et al. | 118/723 |
| 6,440,494 B1 | 8/2002 | Arena-Foster | 427/250 |
| 6,455,414 B1 * | 9/2002 | Hillman et al. | 438/628 |
| 6,472,318 B2 | 10/2002 | Ueno | 438/653 |
| 6,579,806 B2 * | 6/2003 | Nallan et al. | 438/720 |
| 6,634,313 B2 | 10/2003 | Hanawa et al. | 118/723 |
| 6,641,698 B2 | 11/2003 | Kabansky | 156/345.35 |
| 6,749,717 B1 | 6/2004 | Sandhu et al. | 156/345.35 |
| 6,893,953 B2 | 5/2005 | Hoshino et al. | 438/618 |
| 2002/0009872 A1 | 1/2002 | Hoshino et al. | 438/618 |
| 2002/0106846 A1 | 8/2002 | Seutter et al. | 438/200 |
| 2003/0003757 A1 * | 1/2003 | Nallan et al. | 438/710 |
| 2003/0199152 A1 | 10/2003 | Derraa | 438/471 |

FOREIGN PATENT DOCUMENTS

| | | |
|---|---|---|
| EP | 0482265 A1 | 4/1992 |
| EP | 0573348 A1 | 12/1993 |
| EP | 0 658 926 A1 | 6/1995 |
| EP | 0818559 A2 | 1/1998 |
| EP | 0837155 A1 | 4/1998 |
| EP | 0861921 A1 | 9/1998 |
| EP | 1120474 A1 | 8/2001 |
| EP | 1199378 A1 | 4/2002 |
| EP | 1313127 A1 | 5/2003 |
| EP | 1338674 A1 | 8/2003 |
| EP | 1344842 A2 | 9/2003 |
| FR | 2784694 A1 | 4/2000 |
| GB | 2111534 | 7/1983 |
| JP | 7-142389 | 6/1995 |
| JP | 7-193025 | 7/1995 |
| JP | 8-124876 | 5/1996 |
| JP | 9-232313 | 9/1997 |
| JP | 10-209073 | 8/1998 |
| JP | 10-209280 | 8/1998 |
| JP | 2000-195948 | 7/2000 |
| JP | 2001-41802 | 2/2001 |
| JP | 2001-53077 | 2/2001 |
| JP | 2001-118804 | 4/2001 |
| JP | 2001-284285 | 10/2001 |
| JP | 2001-298028 | 10/2001 |

OTHER PUBLICATIONS

Reidel et al.,"MicroElectric Engineering", vol. 5, No. 1-4, pp. 213-218 (2001).

Shew et al.,"Thin Solid Films", vol. 293, No. 1-2, pp. 212-219 (1997).

Widmann et al., "Technologies Hochintegrierter Schaltungen", pp. 181-222 (1996).

Yamada et al., "Journal of the Electrochemical Society", vol. 138, No. 2, pp. 496-499 (1991).

Yanagisawa et al., "Damage-free Flattening Technology of Large Diameter Si Wafer Employing Numerically controlled Local SF6/H2 Downstream Plasma", Microprocesses and Nanotechnology conference, 2000 International, pp. 274-275 (Jul. 11-13, 2000).

* cited by examiner

BARRIER METAL FILM PRODUCTION METHOD

This is a Continuation-In-Part of U.S. application Ser. No. 11/252,811, filed Oct. 19, 2005, now pending, which is a Divisional of U.S. application Ser. No. 10/277,733, filed Oct. 23, 2002, now abandoned, with claims the benefits of Japanese Patent Application No. 2002-44296 filed on Feb. 21, 2002, Japanese Patent Application No. 2002-44289 filed on Feb. 21, 2002, Japanese Patent Application No. 2002-027738 filed on Feb. 5, 2002, and Japanese Patent Application No. 2001-348325 filed on Nov. 14, 2001, the entire disclosures of all are incorporated herein by reference in their entirety.

BACKGROUND OF THE INVENTION

1. Field of the Invention

This invention relates to a production method for a barrier metal film to be formed on the surface of a substrate for eliminating the diffusion of a metal into the substrate, when a metal film is formed on the surface of the substrate.

2. Description of Related Art

Semiconductors with electrical wiring have increasingly used copper as a material for the wiring in order to increase the speed of switching, decrease transmission loss, and achieve a high density. In applying the copper wiring, it has been common practice to perform the vapor phase growth method or plating on a substrate having a depression for wiring on its surface, thereby forming a copper film on the surface including the depression.

In forming the copper film on the surface of the substrate, a barrier metal film (for example, a nitride of tantalum, tungsten, titanium or silicon) is prepared beforehand on the surface of the substrate in order to eliminate the diffusion of copper into the substrate, and retain the adhesion of copper. When plating is employed, a copper shielding layer is formed on the barrier metal film by physical or chemical vapor deposition, and used also as an electrode. The barrier metal film has been formed by physical vapor deposition such as sputtering.

The depression for wiring, formed on the surface of the substrate, tends to be decreased in size, and a demand is expressed for a further reduction in the thickness of the barrier metal film. However, the barrier metal film has been produced by use of sputtering, and its directionality is not uniform. With a tiny depression on the surface of the substrate, therefore, the film is formed at the entrance of the depression before being formed in the interior of the depression, resulting in insufficient burial of the depression. Also, the substrate has been badly damaged.

SUMMARY OF THE INVENTION

The present invention has been accomplished in light of the circumstances described above. An object of the invention is to provide a barrier metal film production apparatus and a barrier metal film production method which can form a barrier metal film with excellent burial properties and a very small thickness at a high speed.

According to the present invention, there is provided a barrier metal film production apparatus, comprising:

a chamber accommodating a substrate;

a metallic etched member provided in the chamber at a position opposed to the substrate;

source gas supply means for supplying a source gas containing a halogen to an interior of the chamber between the substrate and the etched member;

plasma generation means which converts an atmosphere within the chamber into a plasma to generate a source gas plasma so that the etched member is etched with the source gas plasma to form a precursor from a metal component contained in the etched member and the source gas;

excitation means for exciting a nitrogen gas in a manner isolated from the chamber;

formation means for forming a metal nitride upon reaction between nitrogen excited by the excitation means and the precursor; and control means which makes a temperature of the substrate lower than a temperature of the formation means to form the metal nitride by the reduction reaction as a film on the substrate.

Thus, a barrier metal film comprising a film of a metal nitride and suppressing diffusion can be prepared by forming a metal with the use of a plasma. The barrier metal film can be formed uniformly to a small thickness. Consequently, the barrier metal film can be formed highly accurately at a high speed with excellent burial properties in a very small thickness even to the interior of a tiny depression, for example several hundred nanometers wide, which has been provided in the substrate.

According to the present invention, there is also provided a barrier metal film production apparatus, comprising:

a chamber accommodating a substrate;

a metallic etched member provided in the chamber at a position opposed to the substrate;

source gas supply means for supplying a source gas containing a halogen to an interior of the chamber between the substrate and the etched member;

plasma generation means which converts an atmosphere within the chamber into a plasma to generate a source gas plasma so that the etched member is etched with the source gas plasma to form a precursor from a metal component contained in the etched member and the source gas;

excitation means for exciting a nitrogen gas in a manner isolated from the chamber;

formation means for forming a metal nitride upon reaction between nitrogen excited by the excitation means and the precursor; and control means which makes a temperature of the substrate lower than a temperature of the formation means to form the metal nitride as a film on the substrate, and after film formation of the metal nitride, stops supply of the nitrogen gas, and makes the temperature of the substrate lower than a temperature of the etched member to form the metal component of the precursor by the reduction reaction as a film on the metal nitride on the substrate.

Thus, a barrier metal film comprising a film of a metal nitride and a metal film and with diffusion suppressed and adhesion improved can be prepared by forming a metal by plasmas. The barrier metal film can be formed uniformly to a small thickness. Consequently, the barrier metal film can be formed highly accurately at a high speed with excellent burial properties in a very small thickness even to the interior of a tiny depression, for example several hundred nanometers wide, which has been provided in the substrate.

According to the present invention, there is also provided a barrier metal film production apparatus, comprising:

a chamber accommodating a substrate;

a metallic etched member provided in the chamber at a position opposed to the substrate;

source gas supply means for supplying a source gas containing a halogen to an interior of the chamber between the substrate and the etched member;

nitrogen gas supply means for supplying a nitrogen gas to an interior of the chamber between the substrate and the etched member;

plasma generation means which converts an atmosphere within the chamber into a plasma to generate a source gas plasma and a nitrogen gas plasma so that the etched member is etched with the source gas plasma to form a precursor from a metal component contained in the etched member and the source gas, and that a metal nitride is formed upon reaction between nitrogen and the precursor; and control means which makes a temperature of the substrate lower than a temperature of the etched member to form the metal nitride by the reduction reaction as a film on the substrate.

Thus, a barrier metal film comprising a film of a metal nitride and a metal film and with diffusion suppressed can be prepared by forming a metal by plasmas. The barrier metal film can be formed uniformly to a small thickness. Also, the supply lines for gases can be simplified, and the number of plasma sources can be decreased, so that the product cost can be reduced. Consequently, the barrier metal film can be formed highly accurately at a high speed and at a low cost with excellent burial properties in a very small thickness even to the interior of a tiny depression, for example several hundred nanometers wide, which has been provided in the substrate.

According to the present invention, there is also provided a barrier metal film production apparatus, comprising:

a chamber accommodating a substrate;

a metallic etched member provided in the chamber at a position opposed to the substrate;

source gas supply means for supplying a source gas containing a halogen to an interior of the chamber between the substrate and the etched member;

nitrogen gas supply means for supplying a nitrogen gas to an interior of the chamber between the substrate and the etched member;

plasma generation means which converts an atmosphere within the chamber into a plasma to generate a source gas plasma and a nitrogen gas plasma so that the etched member is etched with the source gas plasma to form a precursor from a metal component contained in the etched member and the source gas, and that a metal nitride is formed upon reaction between nitrogen and the precursor; and control means which makes a temperature of the substrate lower than a temperature of the etched member to form the metal nitride by the reduction reaction as a film on the substrate, then stops supply of the nitrogen gas, and makes the temperature of the substrate lower than the temperature of the etched member to form the metal component of the precursor as a film on the metal nitride on the substrate.

Thus, a barrier metal film comprising a film of a metal nitride and a metal film and with diffusion suppressed and adhesion improved can be prepared by forming a metal by plasmas. The barrier metal film can be formed uniformly to a small thickness. Also, the supply lines for gases can be simplified, and the number of plasma sources can be decreased, so that the product cost can be reduced. Consequently, the barrier metal film can be formed highly accurately at a high speed and at a low cost with excellent burial properties in a very small thickness even to the interior of a tiny depression, for example several hundred nanometers wide, which has been provided in the substrate.

According to the present invention, there is also provided a barrier metal film production method comprising:

supplying a source gas containing a halogen to an interior of a chamber between a substrate and a metallic etched member;

converting an atmosphere within the chamber into a plasma to generate a source gas plasma so that the etched member is etched with the source gas plasma to form a precursor from a metal component contained in the etched member and the source gas;

exciting a nitrogen gas in a manner isolated from the chamber accommodating the substrate;

forming a metal nitride upon reaction between excited nitrogen and the precursor; and making a temperature of the substrate lower than a temperature of means for formation of the metal nitride to form the metal nitride by the reduction reaction as a film on the substrate.

Thus, a barrier metal film comprising a film of a metal nitride and suppressing diffusion can be prepared by forming a metal by plasma. The barrier metal film can be formed uniformly to a small thickness. Consequently, the barrier metal film can be formed highly accurately at a high speed with excellent burial properties in a very small thickness even to the interior of a tiny depression, for example several hundred nanometers wide, which has been provided in the substrate.

According to the present invention, there is also provided a barrier metal film production method comprising:

supplying a source gas containing a halogen to an interior of a chamber between a substrate and a metallic etched member;

converting an atmosphere within the chamber into a plasma to generate a source gas plasma so that the etched member is etched with the source gas plasma to form a precursor from a metal component contained in the etched member and the source gas;

exciting a nitrogen gas in a manner isolated from the chamber accommodating the substrate;

forming a metal nitride upon reaction between excited nitrogen and the precursor;

making a temperature of the substrate lower than a temperature of means for formation of the metal nitride to form the metal nitride by the reduction reaction as a film on the substrate; and after film formation of the metal nitride, stopping supply of the nitrogen gas, and making the temperature of the substrate lower than a temperature of the etched member to form the metal component of the precursor as a film on the metal nitride on the substrate.

Thus, a barrier metal film comprising a film of a metal nitride and a metal film and with diffusion suppressed and adhesion improved can be prepared by forming a metal by plasmas. The barrier metal film can be formed uniformly to a small thickness. Consequently, the barrier metal film can be formed highly accurately at a high speed with excellent burial properties in a very small thickness even to the interior of a tiny depression, for example several hundred nanometers wide, which has been provided in the substrate.

According to the present invention, there is also provided a barrier metal film production method comprising:

supplying a source gas containing a halogen and a nitrogen gas to an interior of a chamber between a substrate and a metallic etched member;

converting an atmosphere within the chamber into a plasma to generate a source gas plasma and a nitrogen gas plasma so that the etched member is etched with the source gas plasma to form a precursor from a metal component contained in the etched member and the source gas, and that a metal nitride is formed upon reaction between nitrogen and the precursor; and making a temperature of the substrate lower than a temperature of the etched member to form the metal nitride by the reduction reaction as a film on the substrate.

Thus, a barrier metal film comprising a film of a metal nitride and with diffusion suppressed can be prepared by forming a metal by plasmas. The barrier metal film can be formed uniformly to a small thickness. Also, the supply line for gases can be simplified, and the number of plasma sources can be decreased, so that the product cost can be reduced. Consequently, the barrier metal film can be formed highly accurately at a high speed and at a low cost with excellent burial properties in a very small thickness even to the interior of a tiny depression, for example several hundred nanometers wide, which has been provided in the substrate.

According to the present invention, there is also provided a barrier metal film production method comprising:

supplying a source gas containing a halogen and a nitrogen gas to an interior of a chamber between a substrate and a metallic etched member;

converting an atmosphere within the chamber into a plasma to generate a source gas plasma and a nitrogen gas plasma so that the etched member is etched with the source gas plasma to form a precursor from a metal component contained in the etched member and the source gas, and that a metal nitride is formed upon reaction between nitrogen and the precursor;

making a temperature of the substrate lower than a temperature of the etched member to form the metal nitride by the reduction reaction as a film on the substrate; and after film formation of the metal nitride, stopping supply of the nitrogen gas, and making the temperature of the substrate lower than the temperature of the etched member to form the metal component of the precursor as a film on the metal nitride on the substrate.

Thus, a barrier metal film comprising a film of a metal nitride and a metal film and with diffusion suppressed and adhesion improved can be prepared by forming a metal by plasmas. The barrier metal film can be formed uniformly to a small thickness. Also, the supply line for gases can be simplified, and the number of plasma sources can be decreased, so that the product cost can be reduced. Consequently, the barrier metal film can be formed highly accurately at a high speed and at a low cost with excellent burial properties in a very small thickness even to the interior of a tiny depression, for example several hundred nanometers wide, which has been provided in the substrate.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

Figure 1:
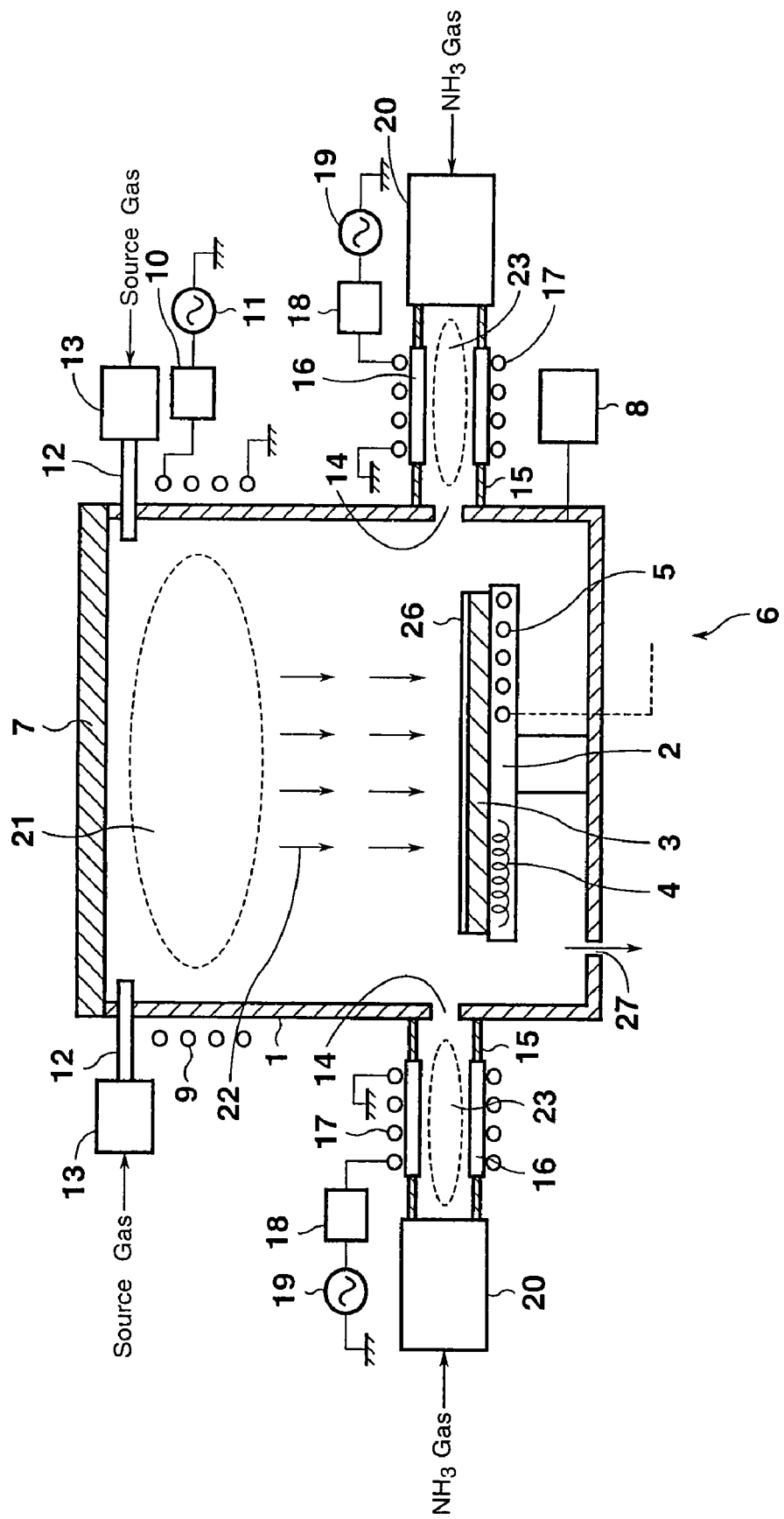
FIG. 1 is a schematic side view of a barrier metal film production apparatus according to a first embodiment of the present invention.
Figure 2:
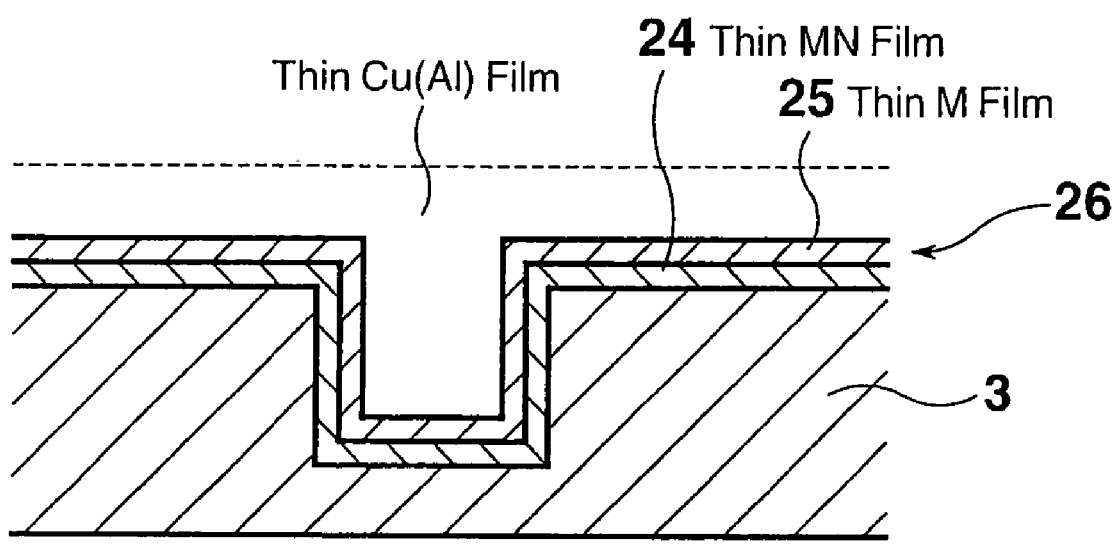
FIG. 2 is a detail view of a substrate on which a barrier metal film has been produced.

The first embodiment of the barrier metal film production apparatus and barrier metal film production method of the present invention will be described with reference to FIGS. 1 and 2. FIG. 1 is a schematic side view of the barrier metal film production apparatus according to the first embodiment of the present invention. FIG. 2 shows details of a substrate on which a barrier metal film has been prepared.

As shown in the drawings, a support platform 2 is provided near the bottom of a cylindrical chamber 1 made of, say, a ceramic (an insulating material), and a substrate 3 is placed on the support platform 2. Temperature control means 6 equipped with a heater 4 and refrigerant flow-through means 5 is provided in the support platform 2 so that the support platform 2 is controlled to a predetermined temperature (for example, a temperature at which the substrate 3 is maintained at 100 to 200° C.) by the temperature control means 6.

An upper surface of the chamber 1 is an opening, which is closed with a metal member 7, as an etched member, made of a metal (e.g., W, Ti, Ta, or TiSi). The interior of the chamber 1 closed with the metal member 7 is maintained at a predetermined pressure by a vacuum device 8. A plasma antenna 9, as a coiled winding antenna 9 of plasma generation means, is provided around a cylindrical portion of the chamber 1. A matching instrument 10 and a power source 11 are connected to the plasma antenna 9 to supply power.

Nozzles 12 for supplying a source gas (a $Cl_2$ gas diluted with He or Ar to a chlorine concentration of $\leq 50\%$, preferably about 10%), containing chlorine as a halogen, to the interior of the chamber 1 are connected to the cylindrical portion of the chamber 1 below the metal member 7. The nozzle 12 is open toward the horizontal, and is fed with the source gas via a flow controller 13. Fluorine (F), bromine (Br) or iodine (I) can also be applied as the halogen to be incorporated into the source gas.

Slit-shaped opening portions 14 are formed at a plurality of locations (for example, four locations) in the periphery of a lower part of the cylindrical portion of the chamber 1, and one end of a tubular passage 15 is fixed to each of the opening portions 14. A tubular excitation chamber 16 made of an insulator is provided halfway through the passage 15, and a coiled plasma antenna 17 is provided around the excitation chamber 16. The plasma antenna 17 is connected to a matching instrument 18 and a power source 19 to receive power.

The plasma antenna 17, the matching instrument 18 and the power source 19 constitute excitation means. A flow controller 20 is connected to the other end of the passage 15, and an ammonia gas (NH$_3$ gas) as a nitrogen gas is supplied into the passage 15 via the flow controller 20.

With the above-described barrier metal film production apparatus, the source gas is supplied through the nozzles 12 to the interior of the chamber 1, and electromagnetic waves are shot from the plasma antenna 9 into the chamber 1. As a result, the Cl$_2$ gas is ionized to generate a Cl$_2$ gas plasma (source gas plasma) 21. The Cl$_2$ gas plasma 21 causes an etching reaction to the metal member 7, forming a precursor (M$_x$Cl$_y$: M is a metal such as W, Ti, Ta or TiSi) 22.

Separately, the NH$_3$ gas is supplied into the passage 15 via the flow controller 20 and fed into the excitation chamber 16. By shooting electromagnetic waves from the plasma antenna 17 into the excitation chamber 16, the NH$_3$ gas is ionized to generate an NH$_3$ gas plasma 23. Since a predetermined differential pressure has been established between the pressure inside the chamber and the pressure inside the excitation chamber 16 by the vacuum device 8, the excited ammonia of the NH$_3$ gas plasma 23 in the excitation chamber 16 is fed to the precursor (M$_x$Cl$_y$) 22 inside the chamber 1 through the opening portion 14.

That is, excitation means for exciting the nitrogen gas in the excitation chamber 16 isolated from the chamber 1 is constructed. Because of this construction, the metal component of the precursor (M$_x$Cl$_y$) 22 and ammonia react to form a metal nitride (MN) (i.e., formation means). At this time, the metal member 7 and the excitation chamber 16 are maintained by the plasmas at predetermined temperatures (e.g., 200 to 400° C.) which are higher than the temperature of the substrate 3.

The metal nitride (MN) formed within the chamber 1 is transported toward the substrate 3 controlled to a low temperature, whereby a thin MN film 24 is formed on the surface of the substrate 3. After the thin MN film 24 is formed, the supply of the NH$_3$ gas and the supply of power to the power source 19 are cut off. Thus, the precursor (M$_x$Cl$_y$) 22 is transported toward the substrate 3 controlled to a lower temperature than the temperature of the metal member 7. The precursor (M$_x$Cl$_y$) 22 transported toward the substrate 3 is converted into only metal (M) ions by a reduction reaction, and directed at the substrate 3 to form a thin M film 25 on the thin MN film 24 on the substrate 3. A barrier metal film 26 is composed of the thin MN film 24 and the thin M film 25 (see FIG. 2).

The reaction for formation of the thin MN film 24 can be expressed by:

2MCl+2NH$_3$→2MN↓+HCl↑+2H$_2$↑

The reaction for formation of the thin M film 25 can be expressed by:

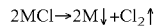

2MCl→2M↓+Cl$_2$↑

The gases and the etching products that have not been involved in the reactions are exhausted through an exhaust port 27.

The source gas has been described, with the Cl$_2$ gas diluted with, say, He or Ar taken as an example. However, the Cl$_2$ gas can be used alone, or an HCl gas can also be applied. If the HCl gas is applied, an HCl gas plasma is generated as the source gas plasma. Thus, the source gas may be any gas containing chlorine, and a gas mixture of an HCl gas and a Cl$_2$ gas is also usable. As the material for the metal member 7, it is possible to use an industrially applicable metal such as Ag, Au, Pt or Si.

The substrate 3, on which the barrier metal film 26 has been formed, is subjected to a film forming device, which forms a thin copper (Cu) film or a thin aluminum (Al) film on the barrier metal film 26. Because of the presence of the barrier metal film 26, there arise advantages, for example, such that the thin MN film 24 eliminates diffusion of Cu into the substrate 3, and the thin M film 25 ensures adhesion of Cu.

If the material to be formed as a film is a material unproblematic in terms of adhesion (e.g., Al), or if it is a metal to which the nitride can retain adhesion, the thin M film 25 can be omitted from the barrier metal film 26. Furthermore, the reduction reaction is caused by the temperature difference. However, a reducing gas plasma can be generated separately to produce a reduction reaction.

With the above-described barrier metal film production apparatus, the metal is formed by plasmas to produce the barrier metal film 26. Thus, the barrier metal film 26 can be formed uniformly to a small thickness. Consequently, the barrier metal film 26 can be formed highly accurately at a high speed with excellent burial properties in a very small thickness even to the interior of a tiny depression, for example several hundred nanometers wide, which has been provided in the substrate 3.

Figure 3:
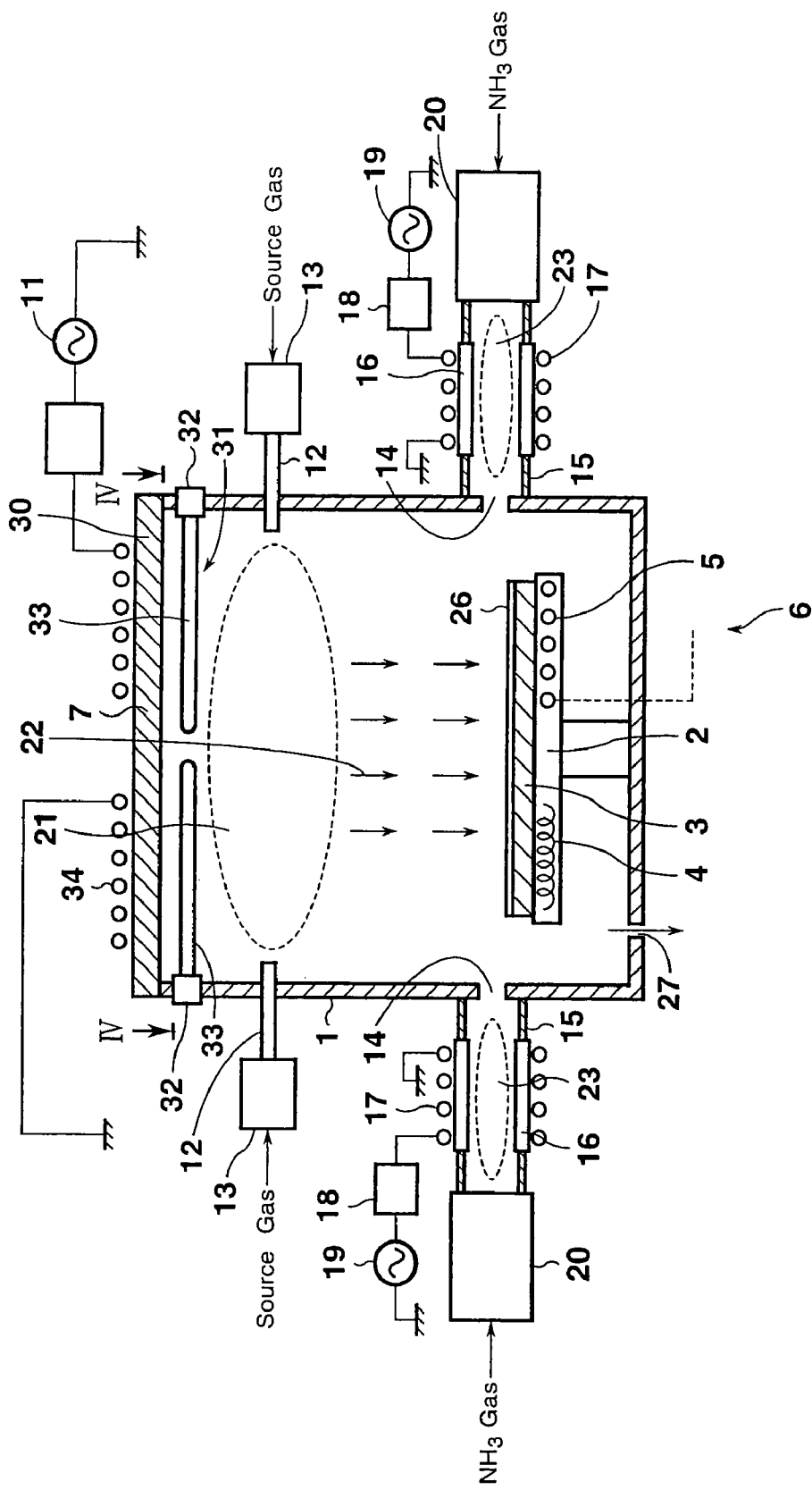
FIG. 3 is a schematic side view of a barrier metal film production apparatus according to a second embodiment of the present invention.
Figure 4:
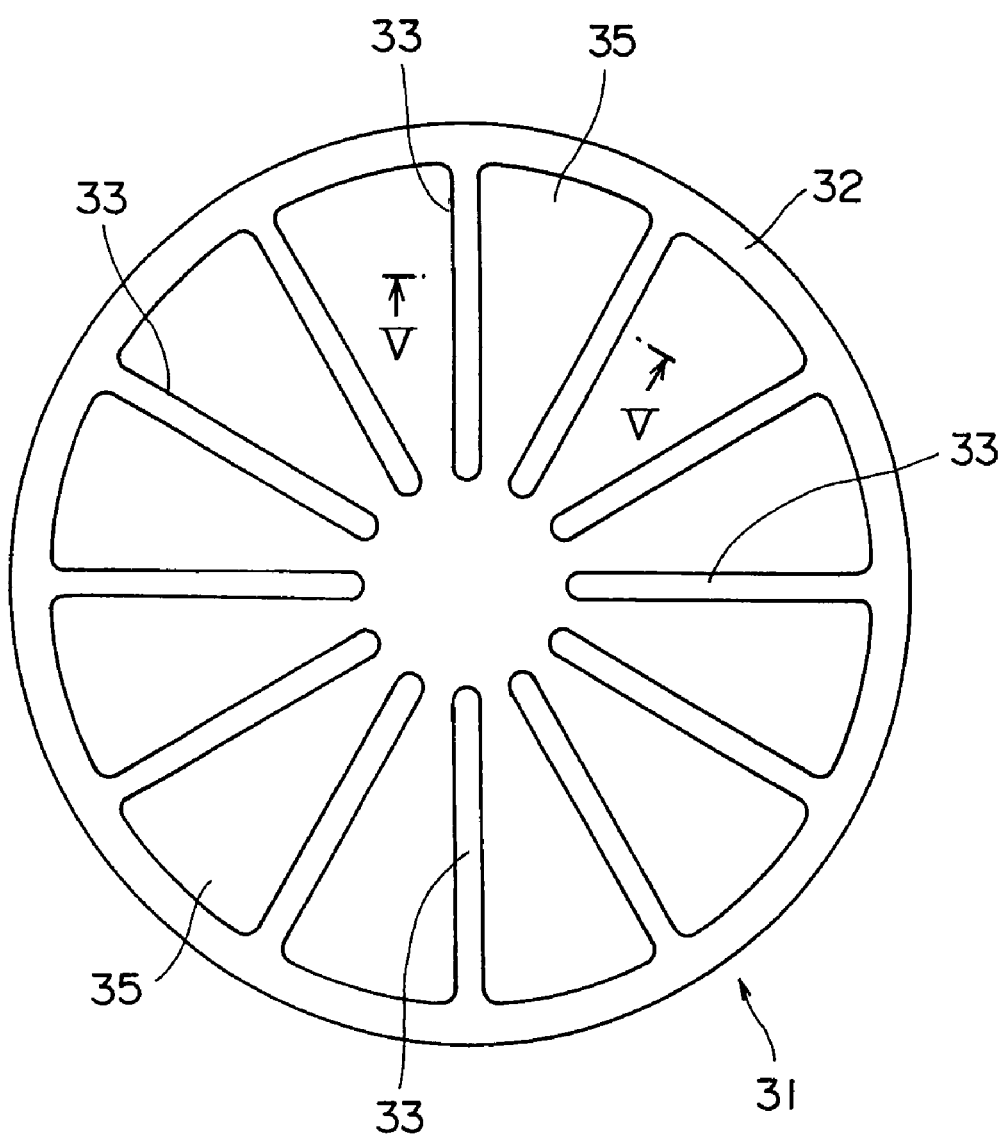
FIG. 4 is a view taken along the arrowed line IV-IV of FIG. 3.
Figure 5:
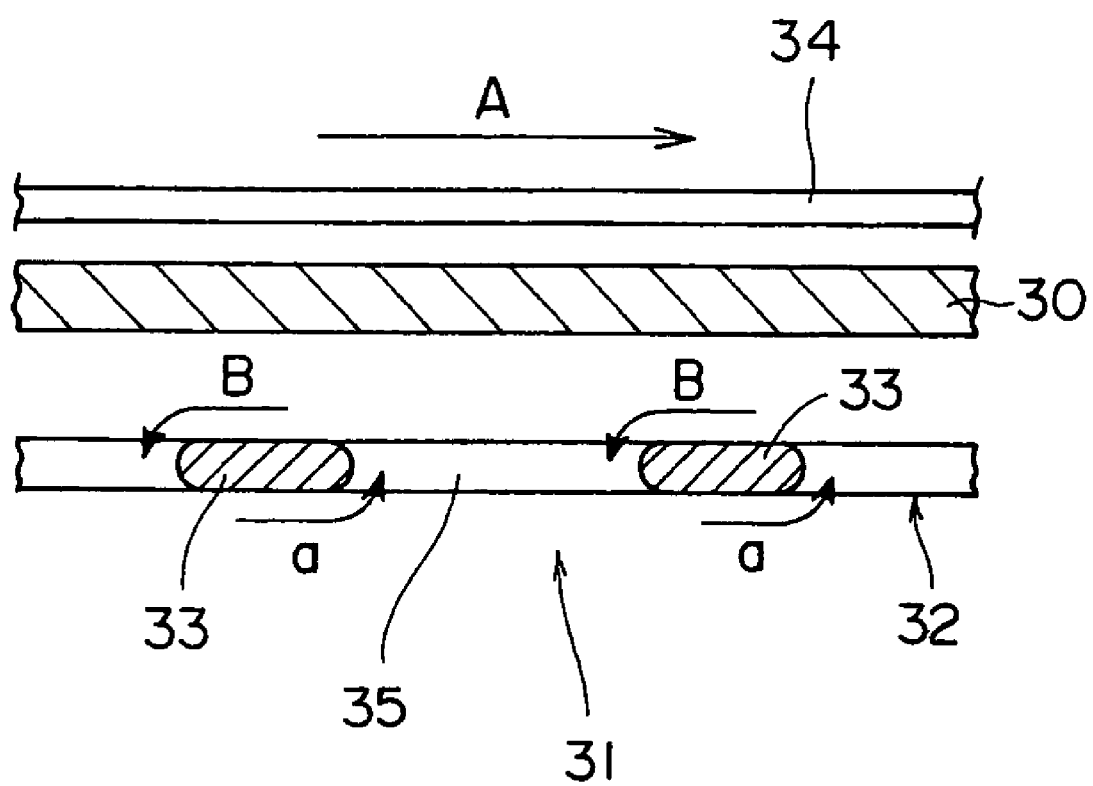
FIG. 5 is a view taken along the arrowed line V-V of FIG. 4.

A barrier metal film production apparatus and a barrier metal film production method according to the second embodiment of the present invention will be described with reference to FIGS. 3 to 5. FIG. 3 is a schematic side view of the barrier metal film production apparatus according to the second embodiment of the present invention. FIG. 4 is a view taken along the arrowed line IV-IV of FIG. 3. FIG. 5 is a view taken along the arrowed line V-V of FIG. 4. The same members as the members illustrated in FIG. 1 are assigned the same numerals, and duplicate explanations are omitted.

An upper surface of the chamber 1 is an opening, which is closed with a disk-shaped ceiling board 30 made of an insulating material (for example, a ceramic). An etched member 31 made of a metal (e.g., W, Ti, Ta or TiSi) is interposed between the opening at the upper surface of the chamber 1 and the ceiling board 30. The etched member 31 is provided with a ring portion 32 fitted into the opening at the upper surface of the chamber 1. A plurality of (12 in the illustrated embodiment) protrusions 33, which extend close to the center in the diametrical direction of the chamber 1 and have the same width, are provided in the circumferential direction on the inner periphery of the ring portion 32.

The protrusions 33 are integrally or removably attached to the ring portion 32. Notches (spaces) 35 formed between the protrusions 33 are present between the ceiling board 30 and the interior of the chamber 1. The ring portion 32 is earthed, and the plural protrusions 33 are electrically connected together and maintained at the same potential. Temperature control means (not shown), such as a heater, is provided in the etched member 31 to control the temperature of the etched member 31 to 200 to 400° C., for example.

Second protrusions shorter in the diametrical direction than the protrusions 33 can be arranged between the protrusions 33. Moreover, short protrusions can be arranged between the protrusion 33 and the second protrusion. By so doing, the area of copper, an object to be etched, can be secured, with an induced current being suppressed.

A planar winding-shaped plasma antenna 34, for converting the atmosphere inside the chamber 1 into a plasma, is provided above the ceiling board 30. The plasma antenna 34 is formed in a planar ring shape parallel to the surface of the ceiling board 30. A matching instrument 10 and a power source 11 are connected to the plasma antenna 34 to supply power. The etched member 31 has the plurality of protrusions 33 provided in the circumferential direction on the inner periphery of the ring portion 32, and includes the notches (spaces) 35 formed between the protrusions 33. Thus, the protrusions 33 are arranged between the substrate 3 and the ceiling board 30 in a discontinuous state relative to the flowing direction of electricity in the plasma antenna 34.

With the above-described barrier metal film production apparatus, the source gas is supplied through the nozzles 12 to the interior of the chamber 1, and electromagnetic waves are shot from the plasma antenna 34 into the chamber 1. As a result, the $Cl_2$ gas is ionized to generate a $Cl_2$ gas plasma (source gas plasma) 21. The etched member 31, an electric conductor, is present below the plasma antenna 34. However, the $Cl_2$ gas plasma 21 occurs stably between the etched member 31 and the substrate 3, namely, below the etched member 31, under the following action:

The action by which the $Cl_2$ gas plasma 21 is generated below the etched member 31 will be described. As shown in FIG. 5, a flow A of electricity in the plasma antenna 34 of the planar ring shape crosses the protrusions 33. At this time, an induced current B occurs on the surface of the protrusion 33 opposed to the plasma antenna 34. Since the notches (spaces) 35 are present in the etched member 31, the induced current B flows onto the lower surface of each protrusion 33, forming a flow a in the same direction as the flow A of electricity in the plasma antenna 34 (Faraday shield).

When the etched member 31 is viewed from the substrate 3, therefore, there is no flow in a direction in which the flow A of electricity in the plasma antenna 34 is canceled out. Furthermore, the ring portion 32 is earthed, and the protrusions 33 are maintained at the same potential. Thus, even though the etched member 31, an electric conductor, exists, the electromagnetic wave is reliably thrown from the plasma antenna 34 into the chamber 1. Consequently, the $Cl_2$ gas plasma 21 is stably generated below the etched member 31.

Furthermore, plasma generation means composed of a passage 15, an excitation chamber 16 and a plasma antenna 17 is provided above the support platform 2.

The $Cl_2$ gas plasma 21 causes an etching reaction to the etched member 31, forming a precursor ($M_xCl_y$: M is a metal such as W, Ti, Ta or TiSi) 22. In the excitation chamber 16, the $NH_3$ gas is ionized to generate an $NH_3$ gas plasma 23. The excited ammonia of the $NH_3$ gas plasma 23 in the excitation chamber 16 is fed to the precursor ($M_xCl_y$) 22 inside the chamber 1 through the opening portion 14. Because of this construction, the metal component of the precursor ($M_xCl_y$) 22 and ammonia react to form a metal nitride (MN) (formation means). At this time, the etched member 31 and the excitation chamber 16 are maintained by the plasmas at predetermined temperatures (e.g., 200 to 400° C.) which are higher than the temperature of the substrate 3.

The metal nitride (MN) formed within the chamber 1 is transported toward the substrate 3 controlled to a low temperature, whereby a thin MN film 24 is formed on the surface of the substrate 3. After the thin MN film 24 is formed, the supply of the $NH_3$ gas and the supply of power to the power source 19 are cut off. Thus, the precursor ($M_xCl_y$) 22 is transported toward the substrate 3 controlled to a lower temperature than the temperature of the etched member 31. The precursor ($M_xCl_y$) 22 transported toward the substrate 3 is converted into only metal (M) ions by a reduction reaction, and directed at the substrate 3 to form a thin M film 25 on the thin MN film 24 on the substrate 3. A barrier metal film 26 is composed of the thin MN film 24 and the thin M film 25 (see FIG. 2). The gases and the etching products, which have not been involved in the reactions, are exhausted through an exhaust port 27.

With the above-described barrier metal film production apparatus, similar to the first embodiment, the metal is formed by plasmas to produce the barrier metal film 26. Thus, the barrier metal film 26 can be formed uniformly to a small thickness. Consequently, the barrier metal film 26 can be formed highly accurately at a high speed with excellent burial properties in a very small thickness even to the interior of a tiny depression, for example several hundred nanometers wide, which has been provided in the substrate 3.

In addition, the etched member 31 has the plurality of protrusions 33 provided in the circumferential direction on the inner periphery of the ring portion 32, and includes the notches (spaces) 35 formed between the protrusions 33. Thus, the induced currents generated in the etched member 31 flow in the same direction as the flowing direction of electricity in the plasma antenna 34, when viewed from the substrate 3. Therefore, even though the etched member 31, an electric conductor, exists below the plasma antenna 34, the electromagnetic waves are reliably thrown from the plasma antenna 34 into the chamber 1. Consequently, the $Cl_2$ gas plasma 21 can be stably generated below the etched member 31.

Figure 6:
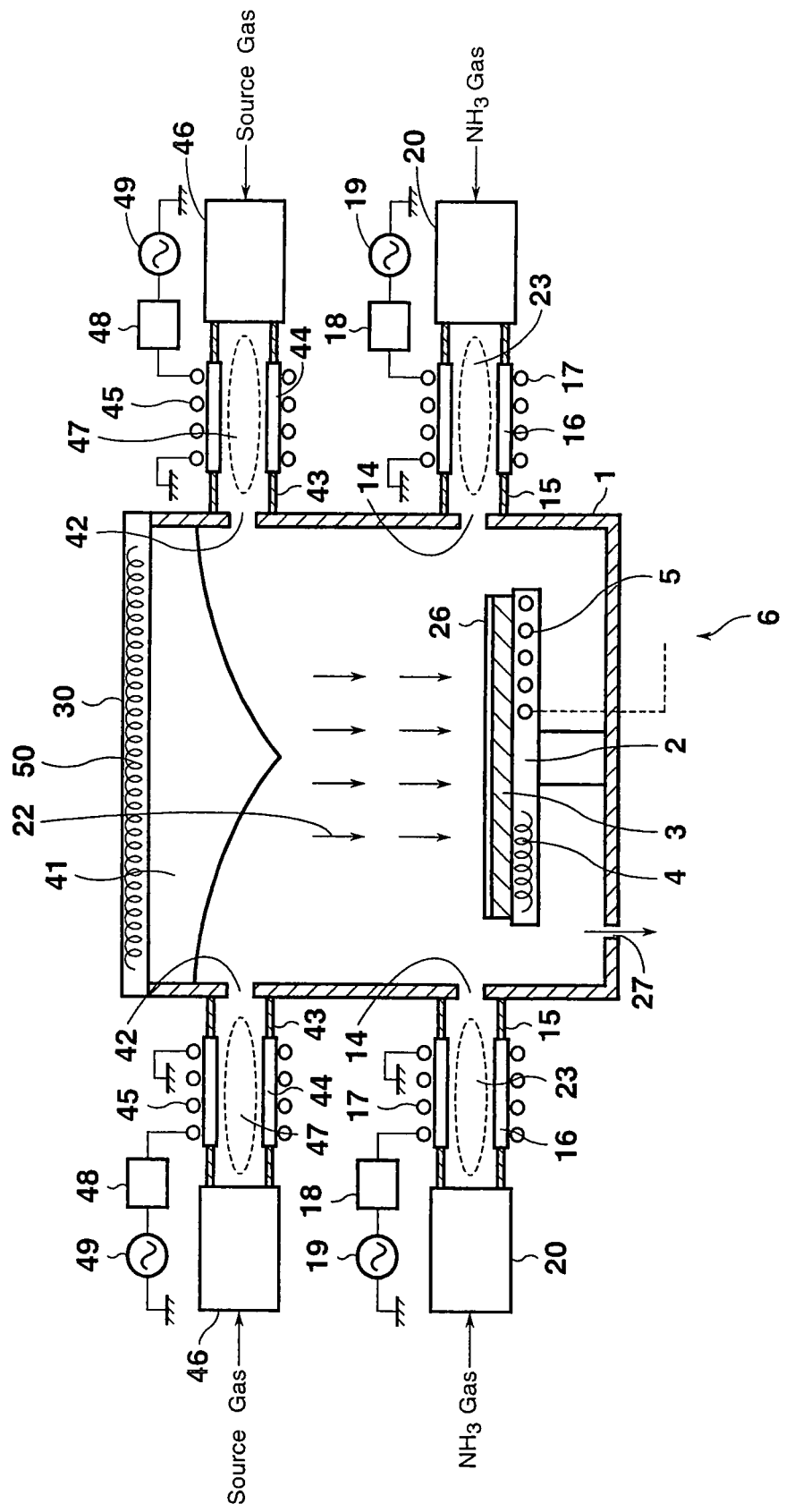
FIG. 6 is a schematic side view of a barrier metal film production apparatus according to a third embodiment of the present invention.

A barrier metal film production apparatus and a barrier metal film production method according to the third embodiment of the present invention will be described with reference to FIG. 6. FIG. 6 is a schematic side view of the barrier metal film production apparatus according to the third embodiment of the present invention. The same members as the members illustrated in FIGS. 1 and 3 are assigned the same numerals, and duplicate explanations are omitted.

The opening of an upper portion of the chamber 1 is closed with a ceiling board 30, for example, made of a ceramic (an insulating material). An etched member 41 made of a metal (e.g., W, Ti, Ta or TiSi) is provided on a lower surface of the ceiling board 30, and the etched member 41 is of a quadrangular pyramidal shape. Slit-shaped second opening portions 42 are formed at a plurality of locations (for example, four locations) in the periphery of an upper part of the cylindrical portion of the chamber 1, and one end of a tubular second passage 43 is fixed to the second opening portion 42.

A tubular second excitation chamber 44 made of an insulator is provided halfway through the second passage 43, and a coiled second plasma antenna 45 is provided around the second excitation chamber 44. The plasma antenna 45 is connected to a matching instrument 48 and a power source 49 to receive power. The second plasma antenna 45, the matching instrument 48 and the power source 49 constitute plasma generation means.

A flow controller 46 is connected to the other end of the second passage 43, and a chlorine-containing source gas (a $Cl_2$ gas diluted with He or Ar to a chlorine concentration of $\leq 50\%$, preferably about 10%) is supplied into the passage 43 via the flow controller 46. By shooting electromagnetic waves from the second plasma antenna 45 into the second excitation chamber 44, the $Cl_2$ gas is ionized to generate a $Cl_2$ gas plasma (source gas plasma) 47. Because of the generation of the $Cl_2$ gas plasma 47, excited chlorine is fed into the chamber 1 through the second opening portion 42, whereupon the etched member 41 is etched with excited chlorine.

With the above-described barrier metal film production apparatus, the source gas is supplied into the second passage 43 via the flow controller 46 and fed into the second excitation chamber 44. By shooting electromagnetic waves from the second plasma antenna 45 into the second excitation chamber 44, the $Cl_2$ gas is ionized to generate a $Cl_2$ gas plasma (source gas plasma) 47. Since a predetermined differential pressure has been established between the pressure inside the chamber 1 and the pressure inside the second excitation chamber 44 by the vacuum device 8, the excited chlorine of the $Cl_2$ gas plasma 47 in the second excitation chamber 44 is fed to the etched member 41 inside the chamber 1 through the second opening portion 42. The excited chlorine causes an etching reaction to the etched member 41, forming a precursor ($M_xCl_y$) 22 inside the chamber 1. At this time, the etched member 41 is maintained at a predetermined temperature (e.g., 200 to 400° C.), which is higher than the temperature of the substrate 3, by a heater 50 provided in the ceiling board 30.

In the excitation chamber 16, the $NH_3$ gas is ionized to generate an $NH_3$ gas plasma 23. The excited ammonia of the $NH_3$ gas plasma 23 in the excitation chamber 16 is fed to the precursor ($M_xCl_y$) 22 inside the chamber 1 through the opening portion 14. As a result, the metal component of the precursor ($M_xCl_y$) 22 and ammonia react to form a metal nitride (MN). At this time, the excitation chamber 16 is maintained by the plasma at a predetermined temperature (e.g., 200 to 400° C.) which is higher than the temperature of the substrate 3.

The metal nitride (MN) formed within the chamber 1 is transported toward the substrate 3 controlled to a low temperature, whereby a thin MN film 24 is formed on the surface of the substrate 3. After the thin MN film 24 is formed, the supply of the $NH_3$ gas and the supply of power to the power source 19 are cut off. Thus, the precursor ($M_xCl_y$) 22 is transported toward the substrate 3 controlled to a lower temperature than the temperature of the etched member 41. The precursor ($M_xCl_y$) 22 transported toward the substrate 3 is converted into only metal (M) ions by a reduction reaction, and directed at the substrate 3 to form a thin M film 25 on the thin MN film 24 placed on the substrate 3. A barrier metal film 26 is composed of the thin MN film 24 and the thin M film 25 (see FIG. 2). The gases and the etching products that have not been involved in the reactions are exhausted through an exhaust port 27.

With the above-described barrier metal film production apparatus, similar to the first embodiment and the second embodiment, the metal is formed by plasmas to produce the barrier metal film 26. Thus, the barrier metal film 26 can be formed uniformly to a small thickness. Consequently, the barrier metal film 26 can be formed highly accurately at a high speed with excellent burial properties in a very small thickness even to the interior of a tiny depression, for example several hundred nanometers wide, which has been provided in the substrate 3.

Furthermore, the $Cl_2$ gas plasma 47 is generated in the second excitation chamber 44 isolated from the chamber 1. Thus, the substrate 3 is not exposed to the plasma any more, and the substrate 3 becomes free from damage from the plasma.

As the means for generating the $Cl_2$ gas plasma 47 in the second excitation chamber 44, namely, the means for exciting the source gas to convert it into an excited source gas, it is possible to use microwaves, laser, electron rays, or synchrotron radiation. It is also permissible to form the precursor by heating the metal filament to a high temperature. The construction for isolating the $Cl_2$ gas plasma 47 from the substrate 3 may be the provision of the second excitation chamber 44 in the passage 43, as stated above, or may be other construction, for example, the isolation of the chamber 1.

Figure 7:
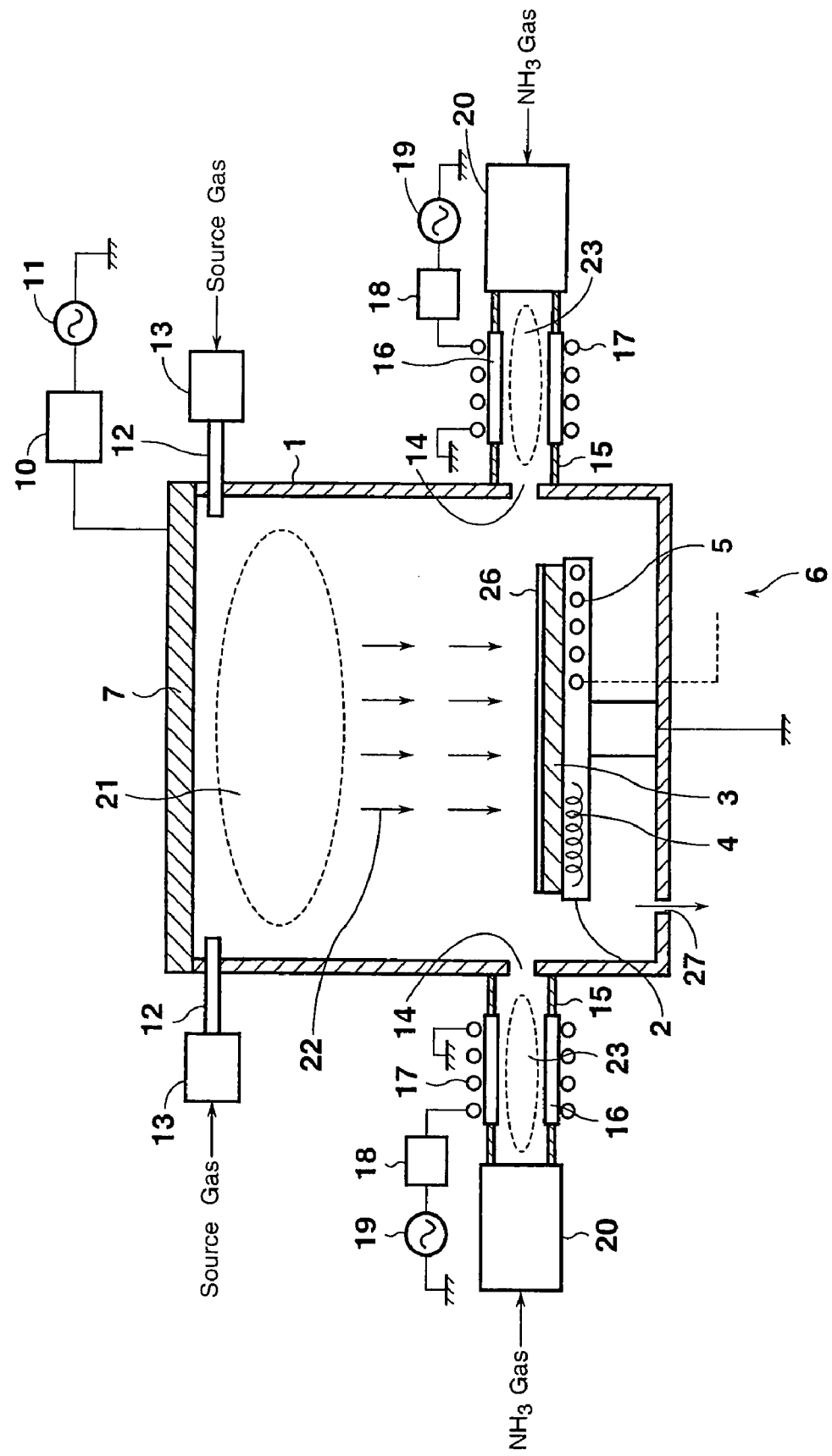
FIG. 7 is a schematic side view of a barrier metal film production apparatus according to a fourth embodiment of the present invention.

A barrier metal film production apparatus and a barrier metal film production method according to the fourth embodiment of the present invention will be described with reference to FIG. 7. FIG. 7 is a schematic side view of a barrier metal film production apparatus according to the fourth embodiment of the present invention. The same members as the members illustrated in FIG. 1 are assigned the same numerals, and duplicate explanations are omitted.

Compared with the barrier metal film production apparatus of the first embodiment shown in FIG. 1, the plasma antenna 9 is not provided around the cylindrical portion of the chamber 1, and the matching instrument 10 and power source 11 are connected to the metal member 7 for supply of power to the metal member 7.

With the above-described barrier metal film production apparatus, the source gas is supplied from the nozzle 12 into the chamber 1, and electromagnetic waves are shot from the metal member 7 into the chamber 1, whereby the $Cl_2$ gas is ionized to generate a $Cl_2$ gas plasma (source gas plasma) 21. The $Cl_2$ gas plasma 21 causes an etching reaction to the metal member 7, forming a precursor ($M_xCl_y$) 22. At this time, the metal member 7 is maintained at a temperature (e.g., 200 to 400° C.), which is higher than the temperature of the substrate 3, by temperature control means (not shown).

In the excitation chamber 16, the $NH_3$ gas is ionized to generate an $NH_3$ gas plasma 23. The excited ammonia of the $NH_3$ gas plasma 23 in the excitation chamber 16 is fed to the precursor ($M_xCl_y$) 22 inside the chamber 1 through the opening portion 14. As a result, the metal component of the precursor ($M_xCl_y$) 22 and ammonia react to form a metal nitride (MN). At this time, the excitation chamber 16 is maintained by the plasma at a predetermined temperature (e.g., 200 to 400° C.) which is higher than the temperature of the substrate 3.

The metal nitride (MN) formed within the chamber 1 is transported toward the substrate 3 controlled to a low temperature, whereby a thin MN film 24 is formed on the surface of the substrate 3. After the thin MN film 24 is formed, the supply of the $NH_3$ gas and the supply of power to the power source 19 are cut off. Thus, the precursor ($M_xCl_y$) 22 is transported toward the substrate 3 controlled to a lower temperature than the temperature of the metal member 7. The precursor ($M_xCl_y$) 22 transported toward the substrate 3 is converted into only metal (M) ions by a reduction reaction, and directed at the substrate 3 to form a thin M film 25 on the thin MN film 24 placed on the substrate 3. A barrier metal film 26 is composed of the thin MN film 24 and the thin M film 25 (see FIG. 2). The gases and the etching products that have not been involved in the reactions are exhausted through an exhaust port 27.

With the above-described barrier metal film production apparatus, similar to the first embodiment to the third embodiment, the metal is formed by plasmas to produce the barrier metal film 26. Thus, the barrier metal film 26 can be formed uniformly to a small thickness. Consequently, the barrier metal film 26 can be formed highly accurately at a high speed with excellent burial properties in a very small thickness even to the interior of a tiny depression, for example several hundred nanometers wide, which has been provided in the substrate 3.

Furthermore, the metal member 7 itself is applied as an electrode for plasma generation. Thus, the plasma antenna 9 need not be provided around the cylindrical portion of the chamber 1, and the degree of freedom of the construction in the surroundings can be increased.

Figure 8:
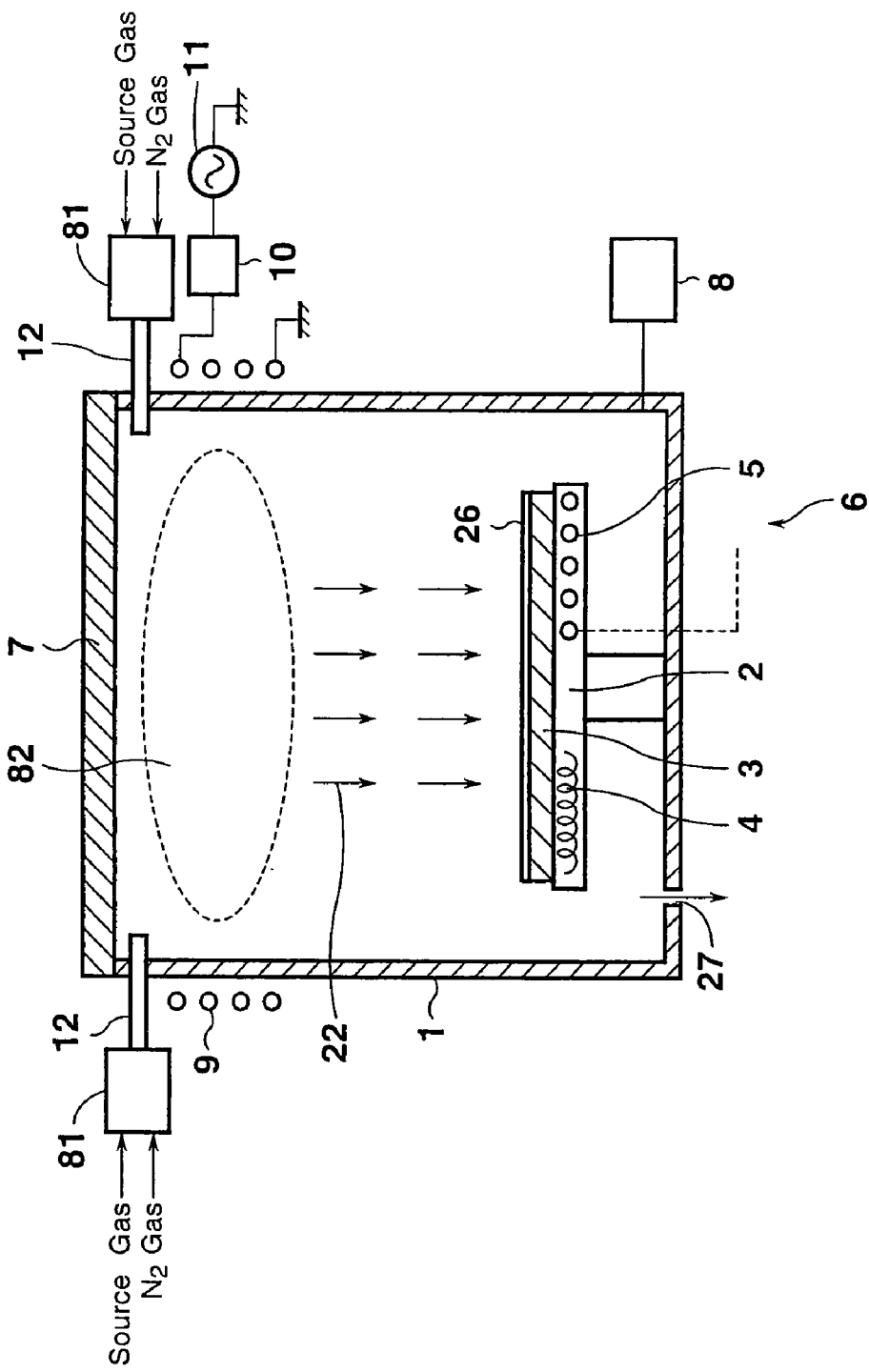
FIG. 8 is a schematic side view of a barrier metal film production apparatus according to a fifth embodiment of the present invention.

A barrier metal film production apparatus and a barrier metal film production method according to the fifth embodiment of the present invention will be described with reference to FIG. 8. FIG. 8 is a schematic side view of the barrier metal film production apparatus according to the fifth embodiment of the present invention. The same members as the members illustrated in FIG. 1 are assigned the same numerals, and duplicate explanations are omitted.

Compared with the first embodiment shown in FIG. 1, the barrier metal film production apparatus shown in FIG. 8 lacks the opening portion 14, passage 15, excitation chamber 16, plasma antenna 17, matching instrument 18, power source 19 and flow controller 20. Nozzles 12 for supplying a gas mixture of a source gas ($Cl_2$ gas) and a nitrogen gas ($N_2$ gas) as a nitrogen gas to the interior of the chamber 1 are connected to the cylindrical portion of the chamber 1. The $Cl_2$ gas and the $N_2$ gas are mixed in a mixed gas flow controller 81, and the gas mixture of the $Cl_2$ gas and the $N_2$ gas is supplied to the nozzle 12 via the mixed gas flow controller 81. Other constructions are the same as in the first embodiment.

With the above-described barrier metal film production apparatus, the mixed gas comprising the $Cl_2$ gas and the $N_2$ gas is supplied through the nozzles 12 to the interior of the chamber 1, and electromagnetic waves are shot from the plasma antenna 9 into the chamber 1. As a result, the $Cl_2$ gas and the $N_2$ gas are ionized to generate a $Cl_2$ gas/$N_2$ gas plasma 82. The $Cl_2$ gas/$N_2$ gas plasma 82 causes an etching reaction to the metal member 7, forming a precursor ($M_xCl_y$: M is a metal such as W, Ti, Ta or TiSi) 22. Also, the precursor 22 and $N_2$ react to form a metal nitride (MN). At this time, the metal member 7 is maintained by the plasma (or temperature control means (not shown)) at a predetermined temperature (e.g., 200 to 400° C.) which is higher than the temperature of the substrate 3.

The metal nitride (MN) formed within the chamber 1 is transported toward the substrate 3 controlled to a low temperature, whereby a thin MN film 24 is formed on the surface of the substrate 3. After the thin MN film 24 is formed, the supply of the $N_2$ gas to the mixed gas flow controller 81 is cut off. Thus, the precursor ($M_xCl_y$) 22 is transported toward the substrate 3 controlled to a lower temperature than the temperature of the metal member 7. The precursor ($M_xCl_y$) 22 transported toward the substrate 3 is converted into only metal (M) ions by a reduction reaction, and directed at the substrate 3 to form a thin M film 25 on the surface of the substrate 3. A barrier metal film 26 is composed of the thin MN film 24 and the thin M film 25 (see FIG. 2).

The substrate 3, on which the barrier metal film 26 has been formed, is to have a thin copper (Cu) film or a thin aluminum (Al) film formed on the barrier metal film 26 by a film forming device. Because of the presence of the barrier metal film 26, there arise advantages, for example, such that the thin MN film 24 eliminates diffusion of Cu into the substrate 3, and the thin M film 25 ensures adhesion of Cu.

If the material to be formed as a film is a material unproblematic in terms of adhesion (e.g., Al), or if it is a metal to which the nitride can retain adhesion, the thin M film 25 can be omitted from the barrier metal film 26.

With the above-described barrier metal film production apparatus, the same effects as in the first embodiment are obtained. In addition, the supply line for the gases can be simplified, and the number of the plasma sources can be decreased. Thus, the cost of the product can be reduced.

Figure 9:
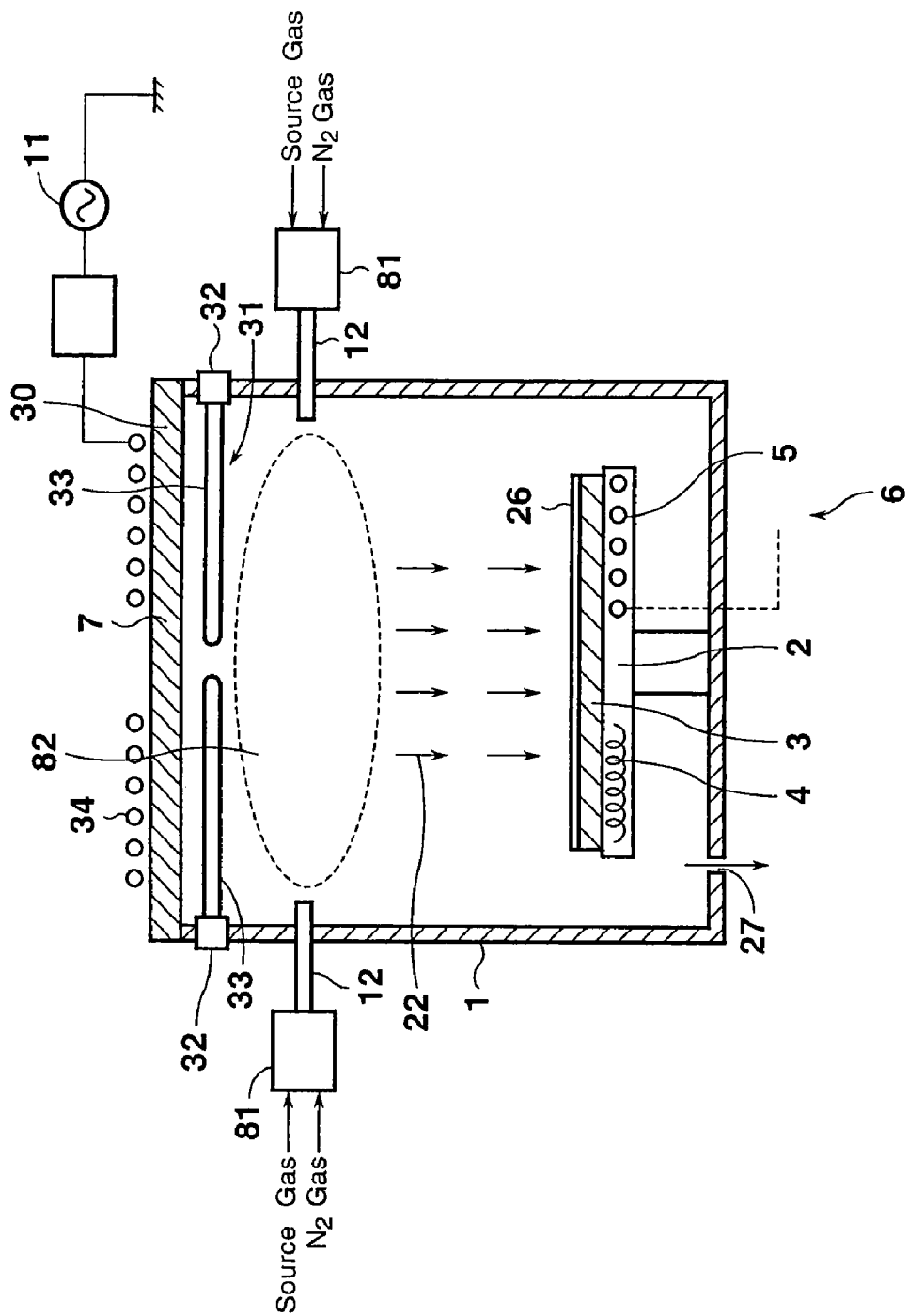
FIG. 9 is a schematic side view of a barrier metal film production apparatus according to a sixth embodiment of the present invention.

The sixth embodiment of a barrier metal film production apparatus and a barrier metal film production method according to the present invention will be described with reference to FIG. 9. FIG. 9 is a schematic side view of the barrier metal film production apparatus according to the sixth embodiment of the present invention. The same members as in the second and fifth embodiments illustrated in FIGS. 3 to 5 and 8 are assigned the same numerals, and duplicate explanations are omitted.

Compared with the second embodiment shown in FIG. 3, the barrier metal film production apparatus shown in FIG. 9 lacks the opening portion 14, passage 15, excitation chamber 16, plasma antenna 17, matching instrument 18, power source 19 and flow controller 20. Nozzles 12 for supplying a gas mixture of a source gas ($Cl_2$ gas) and a nitrogen gas ($N_2$ gas) as a nitrogen gas to the interior of the chamber 1 are connected to the cylindrical portion of the chamber 1. The $Cl_2$ gas and the $N_2$ gas are mixed in a mixed gas flow controller 81, and the gas mixture of the $Cl_2$ gas and the $N_2$ gas is supplied to the nozzle 12 via the mixed gas flow controller 81. Other constructions are the same as in the second embodiment.

With the above-described barrier metal film production apparatus, the mixed gas comprising the $Cl_2$ gas and the $N_2$ gas is supplied through the nozzles 12 to the interior of the chamber 1, and electromagnetic waves are shot from the plasma antenna 34 into the chamber 1. As a result, the $Cl_2$ gas and the $N_2$ gas are ionized to generate a $Cl_2$ gas/$N_2$ gas plasma 82. The etched member 31, an electric conductor, is present below the plasma antenna 34. As stated earlier, however, the $Cl_2$ gas/$N_2$ gas plasma 82 occurs stably between the etched member 31 and the substrate 3, namely, below the etched member 31.

The $Cl_2$ gas/$N_2$ gas plasma 82 causes an etching reaction to the etched member 31, forming a precursor ($M_xCl_y$: M is a metal such as W, Ti, Ta or TiSi) 22. Also, the precursor 22 and $N_2$ react to form a metal nitride (MN). At this time, the etched member 31 is maintained by the plasma (or temperature control means (not shown)) at a predetermined temperature (e.g., 200 to 400° C.) which is higher than the temperature of the substrate 3.

The metal nitride (MN) formed within the chamber 1 is transported toward the substrate 3 controlled to a low temperature, whereby a thin MN film 24 is formed on the surface of the substrate 3. After the thin MN film 24 is formed, the supply of the $N_2$ gas to the mixed gas flow controller 81 is cut off. Thus, the precursor ($M_xCl_y$) 22 is transported toward the substrate 3 controlled to a lower temperature than the temperature of the etched member 31. The precursor ($M_xCl_y$) 22 transported toward the substrate 3 is converted into only metal (M) ions by a reduction reaction, and directed at the substrate 3 to form a thin M film 25 on the thin MN film 24 on the substrate 3. A barrier metal film 26 is composed of the thin MN film 24 and the thin M film 25 (see FIG. 2).

The substrate 3, on which the barrier metal film 26 has been formed, is to have a thin copper (Cu) film or a thin aluminum (Al) film formed on the barrier metal film 26 by a film forming device. Because of the presence of the barrier metal film 26, there arise advantages, for example, such that the thin MN film 24 eliminates diffusion of Cu into the substrate 3, and the thin M film 25 ensures adhesion of Cu.

If the material to be formed as a film is a material unproblematic in terms of adhesion (e.g., Al), or if it is a metal to which the nitride can retain adhesion, the thin M film 25 can be omitted from the barrier metal film 26.

With the above-described barrier metal film production apparatus, the same effects as in the second embodiment are obtained. In addition, the supply line for the gases can be simplified, and the number of the plasma sources can be decreased. Thus, the cost of the product can be reduced.

Figure 10:
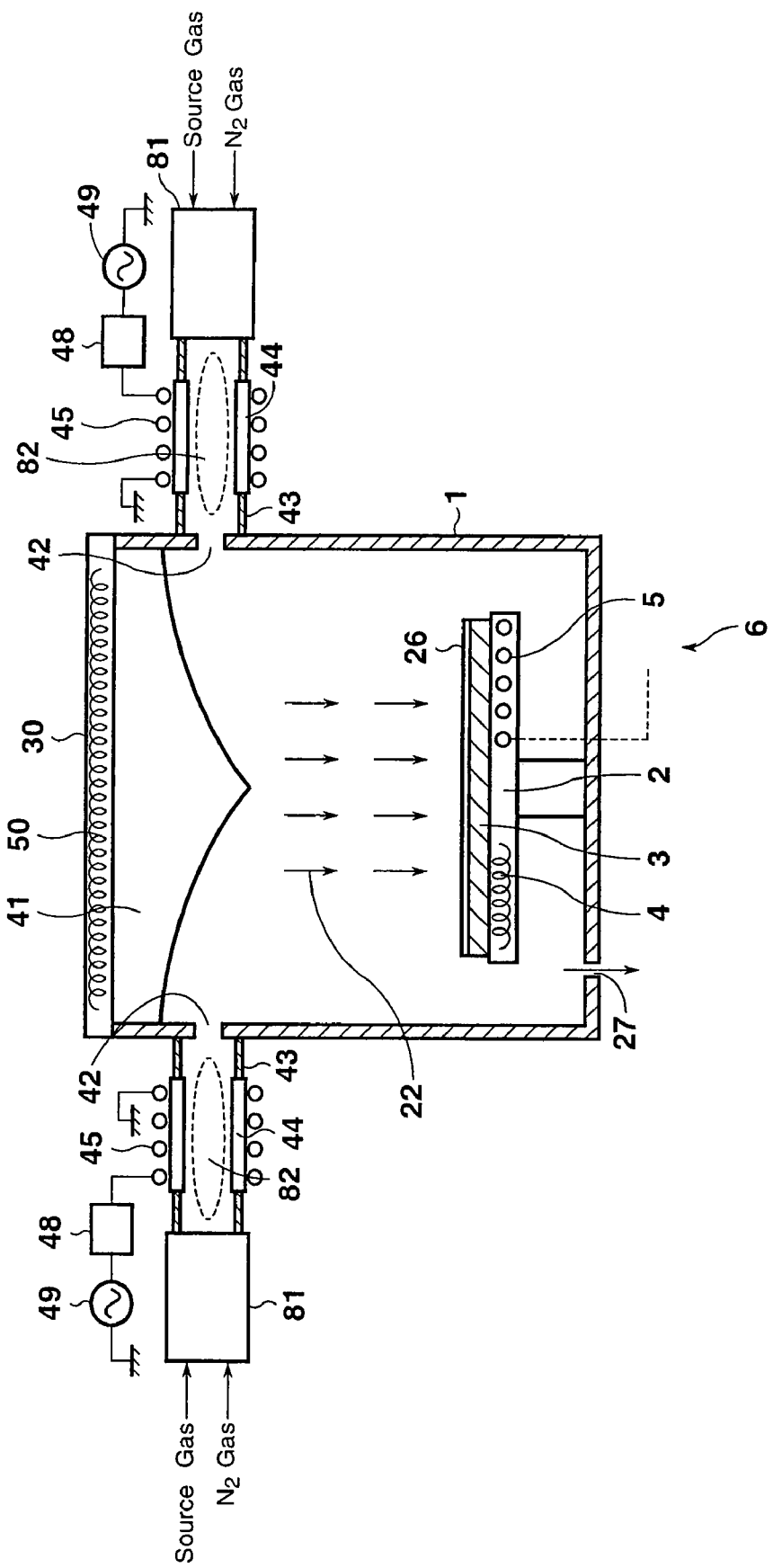
FIG. 10 is a schematic side view of a barrier metal film production apparatus according to a seventh embodiment of the present invention.

The seventh embodiment of a barrier metal film production apparatus and a barrier metal film production method according to the present invention will be described with reference to FIG. 10. FIG. 10 is a schematic side view of the barrier metal film production apparatus according to the seventh embodiment of the present invention. The same members as in the third and fifth embodiments illustrated in FIGS. 6 and 8 are assigned the same numerals, and duplicate explanations are omitted.

Compared with the third embodiment shown in FIG. 6, the barrier metal film production apparatus shown in FIG. 10 lacks the opening portion 14, passage 15, excitation chamber 16, plasma antenna 17, matching instrument 18, power source 19 and flow controller 20. A gas mixture of a source gas ($Cl_2$ gas) and a nitrogen gas ($N_2$ gas) as a nitrogen gas is supplied from a mixed gas flow controller 81 to a second excitation chamber 44. Other constructions are the same as in the third embodiment.

With the above-described barrier metal film production apparatus, the mixed gas comprising the $Cl_2$ gas and the $N_2$ gas is supplied into a second passage 43 via the mixed gas flow controller 81, and fed into the second excitation chamber 44. Electromagnetic waves are shot from a second plasma antenna 45 into the second excitation chamber 44. As a result, the $Cl_2$ gas and the $N_2$ gas are ionized to generate a $Cl_2$ gas/$N_2$ gas plasma 82. Since a predetermined differential pressure has been established between the pressure inside the chamber and the pressure inside the second excitation chamber 44 by the vacuum device 8, the excited chlorine and excited nitrogen of the $Cl_2$ gas/$N_2$ gas plasma 82 in the second excitation chamber 44 are fed to the etched member 41 inside the chamber 1 through the second opening portion 42. The excited chlorine causes an etching reaction to the etched member 41, forming a precursor ($M_xCl_y$) 22 inside the chamber 1. Also, the precursor 22 and the excited nitrogen react to form a metal nitride (MN). At this time, the etched member 41 is maintained at a predetermined temperature (e.g., 200 to 400° C.), which is higher than the temperature of the substrate 3, by a heater 50 provided in a ceiling board 30.

The metal nitride (MN) formed within the chamber 1 is transported toward the substrate 3 controlled to a low temperature, whereby a thin MN film 24 is formed on the surface of the substrate 3. After the thin MN film 24 is formed, the supply of the $N_2$ gas to the mixed gas flow controller 81 is cut off. Thus, the precursor ($M_xCl_y$) 22 is transported toward the substrate 3 controlled to a lower temperature than the temperature of the etched member 41. The precursor ($M_xCl_y$) 22 transported toward the substrate 3 is converted into only metal (M) ions by a reduction reaction, and directed at the substrate 3 to form a thin M film 25 on the thin MN film 24 on the substrate 3. A barrier metal film 26 is composed of the thin MN film 24 and the thin M film 25 (see FIG. 2).

The substrate 3, on which the barrier metal film 26 has been formed, is to have a thin copper (Cu) film or a thin aluminum (Al) film formed on the barrier metal film 26 by a film forming device. Because of the presence of the barrier metal film 26, there arise advantages, for example, such that the thin MN film 24 eliminates diffusion of Cu into the substrate 3, and the thin M film 25 ensures adhesion of Cu.

If the material to be formed as a film is a material unproblematic in terms of adhesion (e.g., Al), or if it is a metal to which the nitride can retain adhesion, the thin M film 25 can be omitted from the barrier metal film 26.

With the above-described barrier metal film production apparatus, the same effects as in the third embodiment are obtained. In addition, the supply line for the gases can be simplified, and the number of the plasma sources can be decreased. Thus, the cost of the product can be reduced.

Figure 11:
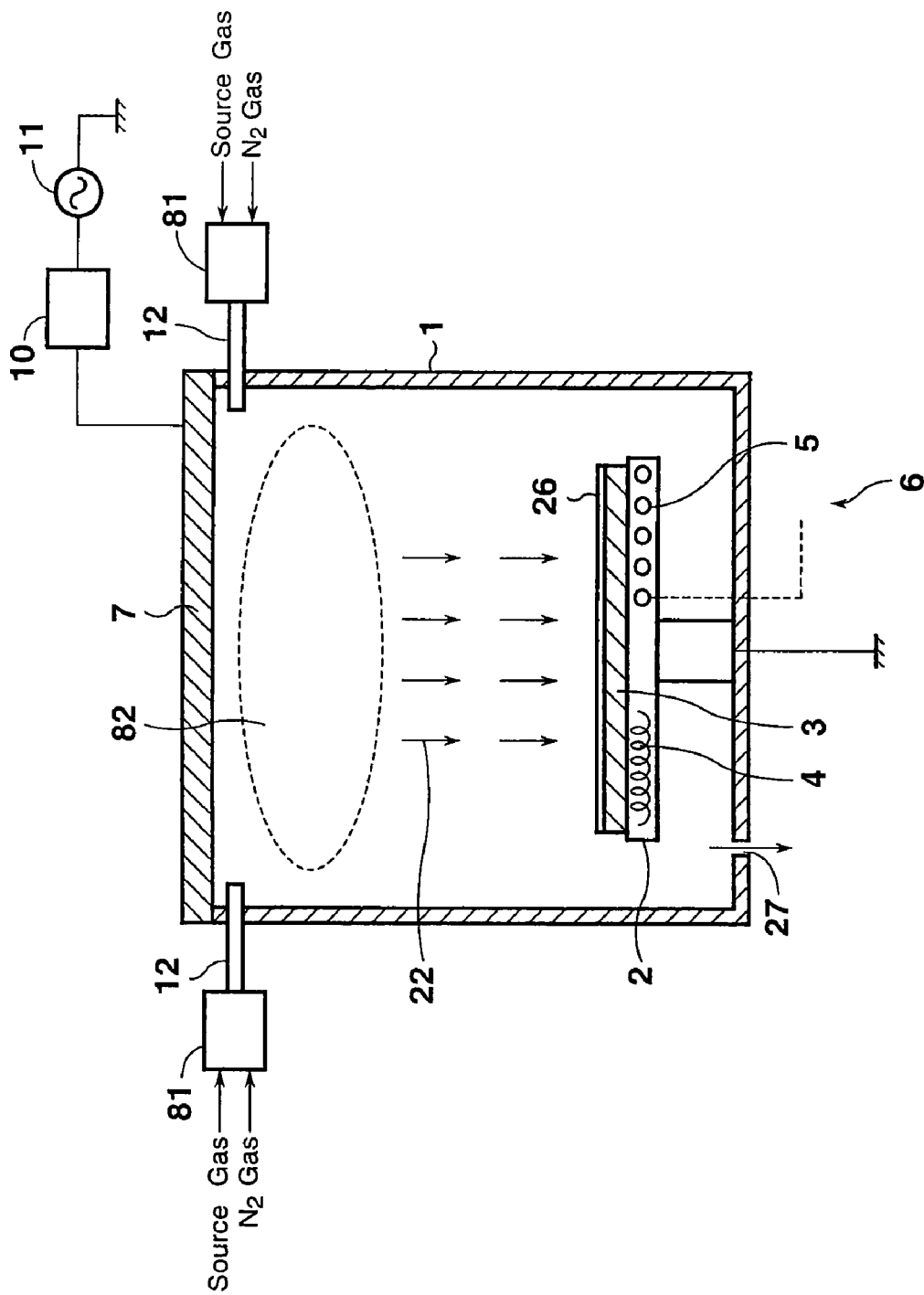
FIG. 11 is a schematic side view of a barrier metal film production apparatus according to an eighth embodiment of the present invention.

The eighth embodiment of a barrier metal film production apparatus and a barrier metal film production method according to the present invention will be described with reference to FIG. 11. FIG. 11 is a schematic side view of the barrier metal film production apparatus according to the eighth embodiment of the present invention. The same members as in the fourth embodiment and the fifth embodiment illustrated in FIGS. 7 and 8 are assigned the same numerals, and duplicate explanations are omitted.

Compared with the fourth embodiment shown in FIG. 7, the barrier metal film production apparatus shown in FIG. 11 lacks the opening portion 14, passage 15, excitation chamber 16, plasma antenna 17, matching instrument 18, power source 19 and flow controller 20. Nozzles 12 for supplying a gas mixture of a source gas ($Cl_2$ gas) and a nitrogen gas ($N_2$ gas) as a nitrogen gas to the interior of the chamber 1 are connected to the cylindrical portion of the chamber 1. The $Cl_2$ gas and the $N_2$ gas are mixed in a mixed gas flow controller 81, and the gas mixture of the $Cl_2$ gas and the $N_2$ gas is supplied to the nozzle 12 via the mixed gas flow controller 81. Other constructions are the same as in the fourth embodiment.

With the above-described barrier metal film production apparatus, the mixed gas comprising the $Cl_2$ gas and the $N_2$ gas is supplied through the nozzles 12 to the interior of the chamber 1, and electromagnetic waves are shot from the metal member 7 into the chamber 1. As a result, the $Cl_2$ gas and the $N_2$ gas are ionized to generate a $Cl_2$ gas/$N_2$ gas plasma 82. The $Cl_2$ gas/$N_2$ gas plasma 82 causes an etching reaction to the metal member 7, forming a precursor ($M_xCl_y$: M is a metal such as W, Ti, Ta or TiSi) 22. Also, the precursor 22 and $N_2$ react to form a metal nitride (MN). At this time, the metal member 7 is maintained by the plasma (or temperature control means (not shown)) at a predetermined temperature (e.g., 200 to 400° C.) which is higher than the temperature of the substrate 3.

The metal nitride (MN) formed within the chamber 1 is transported toward the substrate 3 controlled to a low temperature, whereby a thin MN film 24 is formed on the surface of the substrate 3. After the thin MN film 24 is formed, the supply of the $N_2$ gas to the mixed gas flow controller 81 is cut off. Thus, the precursor ($M_xCl_y$) 22 is transported toward the substrate 3 controlled to a lower temperature than the temperature of the metal member 7. The precursor ($M_xCl_y$) 22 transported toward the substrate 3 is converted into only metal (M) ions by a reduction reaction, and directed at the substrate 3 to form a thin M film 25 on the thin MN film 24 on the substrate 3. A barrier metal film 26 is composed of the thin MN film 24 and the thin M film 25 (see FIG. 2).

The substrate 3, on which the barrier metal film 26 has been formed, is to have a thin copper (Cu) film or a thin aluminum (Al) film formed on the barrier metal film 26 by a film forming device. Because of the presence of the barrier metal film 26, there arise advantages, for example, such that the thin MN film 24 eliminates diffusion of Cu into the substrate 3, and the thin M film 25 ensures adhesion of Cu.

If the material to be formed as a film is a material unproblematic in terms of adhesion (e.g., Al), or if it is a metal to which the nitride can retain adhesion, the thin M film 25 can be omitted from the barrier metal film 26.

With the above-described barrier metal film production apparatus, the same effects as in the fourth embodiment are obtained. In addition, the supply line for the gases can be simplified, and the number of the plasma sources can be decreased. Thus, the cost of the product can be reduced.

In the foregoing fifth to eighth embodiments, the $N_2$ gas is mixed with the $Cl_2$ gas in the mixed gas flow controller 81, and the gas mixture is supplied into the chamber 1. However, the $N_2$ gas and the $Cl_2$ gas can be supplied through separate nozzles. Also, ammonia can be applied as the nitrogen-containing gas.

While the present invention has been described by the foregoing embodiments, it is to be understood that the invention is not limited thereby, but may be varied in many other ways. Such variations are not to be regarded as a departure from the spirit and scope of the invention, and all such modifications as would be obvious to one skilled in the art are intended to be included within the scope of the appended claims.

What is claimed is:

1. A barrier metal film production method comprising:
supplying a source gas containing a halogen to an interior of a chamber between a substrate and a metallic etched member;
converting an atmosphere within the chamber into a plasma to generate a source gas plasma so that the etched member is etched with the source gas plasma to form a precursor from a metal component contained in the etched member and the source gas;
exciting nitrogen gas in a manner isolated from the chamber accommodating the substrate;
forming a metal nitride upon reaction between excited nitrogen and the precursor; and
making a temperature of the substrate lower than a temperature of means for formation of the metal nitride to form the metal nitride by the reduction reaction as a film on the substrate.

2. A barrier metal film production method comprising:
supplying a source gas containing a halogen to an interior of a chamber between a substrate and a metallic etched member;
converting an atmosphere within the chamber into a plasma to generate a source gas plasma so that the etched member is etched with the source gas plasma to form a precursor from a metal component contained in the etched member and the source gas;
exciting a nitrogen gas in a manner isolated from the chamber accommodating the substrate;
forming a metal nitride upon reaction between excited nitrogen and the precursor; and
making a temperature of the substrate lower than a temperature of means for formation of the metal nitride to form the metal nitride by the reduction reaction as a film on the substrate; and
after film formation of the metal nitride, stopping supply of the nitrogen gas, and making the temperature of the substrate lower than a temperature of the etched member to form the metal component of the precursor by the reduction reaction as a film on the metal nitride on the substrate.

* * * * *